United States Patent
Hirigoyen et al.

(10) Patent No.: US 9,521,304 B2
(45) Date of Patent: Dec. 13, 2016

(54) MULTIPLE PHOTOSITES PIXEL ARCHITECTURE

(71) Applicant: STMICROELECTRONICS (GRENOBLE 2) SAS, Grenoble (FR)

(72) Inventors: Flavien Hirigoyen, Grenoble (FR); Emilie Huss, Saint Paul de Varces (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/838,456

(22) Filed: Aug. 28, 2015

(65) Prior Publication Data
US 2016/0182780 A1    Jun. 23, 2016

(30) Foreign Application Priority Data

Dec. 19, 2014   (FR) ...................... 14 62964

(51) Int. Cl.
*H04N 5/225* (2006.01)
*H01L 27/146* (2006.01)

(52) U.S. Cl.
CPC ........ *H04N 5/2253* (2013.01); *H01L 27/1463* (2013.01); *H01L 27/14627* (2013.01); *H01L 27/14643* (2013.01); *H04N 5/2254* (2013.01)

(58) Field of Classification Search
CPC ........... H01L 27/14603; H01L 27/1463; H01L 27/14641; H01L 27/14643; H01L 27/14689; H01L 27/14612; H01L 27/14609; H01L 27/14614; H01L 27/14605; H04N 5/37457; H04N 5/3745; H04N 5/369; H04N 5/3696; H04N 5/3742; H04N 5/37452
See application file for complete search history.

(56) References Cited

U.S. PATENT DOCUMENTS

| | | | | |
|---|---|---|---|---|
| 6,657,665 | B1 * | 12/2003 | Guidash | H01L 27/14603 257/E27.131 |
| 7,446,359 | B2 * | 11/2008 | Lee | H01L 27/14603 257/291 |
| 7,667,183 | B2 * | 2/2010 | Lee | H01L 27/14603 250/208.1 |
| 7,812,878 | B2 * | 10/2010 | Kudoh | H01L 27/14603 348/308 |
| 7,990,444 | B2 * | 8/2011 | Kudoh | H01L 27/14603 257/294 |
| 8,101,450 | B1 * | 1/2012 | Doan | H01L 27/1463 438/218 |
| 8,111,311 | B2 * | 2/2012 | Iwane | H01L 27/14603 257/291 |
| 8,405,751 | B2 * | 3/2013 | Hibbeler | H01L 27/14609 250/208.1 |

(Continued)

*Primary Examiner* — Michael Osinski
(74) *Attorney, Agent, or Firm* — Allen, Dyer, Doppelt, Milbrath & Gilchrist, P.A.

(57) ABSTRACT

An image sensor pixel may include an array of four photosites, a transverse isolator wall separating the array in two rows of two photosites, and a longitudinal isolator wall separating the array in two columns of two photosites. Both ends of the longitudinal wall may be set back relative to the edges of the array. First and second conversion nodes may be arranged in the spaces between the longitudinal wall and the edges of the matrix. Each conversion node may be common to two adjacent photosites, and an independent transfer gate may be between each photosite and the corresponding conversion node.

18 Claims, 2 Drawing Sheets

(56) References Cited

U.S. PATENT DOCUMENTS

| | | | | |
|---|---|---|---|---|
| 8,471,312 B2* | 6/2013 | Kudoh | ............... | H01L 27/14603 257/292 |
| 8,610,810 B2* | 12/2013 | Shah | ................. | H04N 5/37457 348/303 |
| 8,680,453 B2* | 3/2014 | Roy | .................. | H01L 27/14603 250/208.1 |
| 8,829,579 B2* | 9/2014 | Masuda | .............. | H01L 27/1463 257/291 |
| 9,024,240 B2* | 5/2015 | Roy | .................. | H01L 27/14603 250/208.1 |
| 9,179,082 B2* | 11/2015 | Itonaga | ............. | H01L 27/14603 |
| 9,185,319 B2 | 11/2015 | Mayer et al. | | |
| 9,252,251 B2* | 2/2016 | Hirler | ................. | H01L 29/1095 |
| 9,288,380 B2* | 3/2016 | Nomura | ............. | H04N 5/23212 |
| 9,293,494 B2* | 3/2016 | Ahn | .................... | H01L 27/1463 |
| 9,312,298 B2* | 4/2016 | Yamashita | ........ | H01L 27/14643 |
| 9,406,713 B2* | 8/2016 | Fan | .................... | H01L 27/14643 |
| 9,450,114 B2* | 9/2016 | Yamaguchi | ....... | H01L 27/14607 |
| 2004/0135063 A1* | 7/2004 | Dosluoglu | ........ | H01L 27/14603 250/208.1 |
| 2005/0194629 A1* | 9/2005 | Henninger | ............ | H01L 29/407 257/302 |
| 2006/0125947 A1 | 6/2006 | Packer et al. | | |
| 2007/0052056 A1* | 3/2007 | Doi | ..................... | H01L 27/1463 257/462 |
| 2007/0158713 A1* | 7/2007 | Ohkawa | ............ | H01L 27/14603 257/292 |
| 2007/0246788 A1* | 10/2007 | Mauritzson | ......... | H01L 27/1463 257/431 |
| 2009/0046186 A1* | 2/2009 | Nagai | ............... | H01L 27/14603 348/301 |
| 2009/0266973 A1 | 10/2009 | Roy et al. | | |
| 2010/0252718 A1* | 10/2010 | Lee | .................... | H01L 27/14603 250/208.1 |
| 2011/0108938 A1* | 5/2011 | Nozaki | ............. | H01L 27/14621 257/432 |
| 2012/0018618 A1 | 1/2012 | Roy et al. | | |
| 2014/0071244 A1* | 3/2014 | Hirota | ................ | H04N 13/0217 348/46 |
| 2014/0078337 A1 | 3/2014 | Tsuchiya | | |
| 2014/0183685 A1 | 7/2014 | Roy et al. | | |
| 2015/0091122 A1* | 4/2015 | Okazaki | ............ | H01L 27/1463 257/446 |
| 2015/0279891 A1* | 10/2015 | Chen | ................. | H01L 27/14636 257/459 |
| 2015/0372031 A1* | 12/2015 | Yoon | ................ | H01L 27/14603 257/446 |
| 2016/0021322 A1* | 1/2016 | Jung | ...................... | H04N 5/378 250/208.1 |
| 2016/0043120 A1* | 2/2016 | Ahn | .................... | H01L 27/1463 257/229 |
| 2016/0093651 A1* | 3/2016 | Sato | .................... | H04N 5/3745 257/229 |
| 2016/0225812 A1* | 8/2016 | Elkhatib | ............ | H01L 31/02327 |

\* cited by examiner

MULTIPLE PHOTOSITES PIXEL ARCHITECTURE

TECHNICAL FIELD

This disclosure relates to image sensors, and more particularly to image sensors for use in phase detection autofocus systems.

BACKGROUND

FIG. 1 schematically illustrates elements of a phase detection autofocus system. The system includes two parallel sets of photosensitive pixels Pa and Pb placed in the image plane of an optical system or lens L. The pixels of the first set Pa have their right half masked by a metal layer M, while the pixels of the second set have their left half masked. A collimating lens the size of the pixel is further mounted over each pixel.

With this configuration, given the inclination of the rays arriving at the pixels and collimating lenses, the pixels of the first set Pa essentially see the light rays passing through the left half of the lens L. The pixels of the second set Pb essentially see the rays passing through the right half of the lens L.

If the focus adjustment of the lens L is incorrect, the images captured by the two sets of pixels are spatially phase shifted. The autofocus system is designed to measure this phase shift and correct the lens adjustment to tend towards the alignment of the two images.

Physically hiding each photosensitive pixel distorts the characteristics of the pixels, so that their integration into a main image sensor could decrease image quality and require corrective processing. Thus, such masked pixels have often been provided in a separate sensor dedicated to focusing.

Rather than achieving a physical masking of the pixels, an electronic masking may be considered using dual pixels having two photosites, as described in US patent publication no. 2014/0078337. Such pixels may be integrated into the main image sensor. Then, during a focusing phase, the system uses a single photosite of the dual pixels, i.e., the left or right one depending on the row. For shooting the final image, the system uses the two photosites of each pixel and adds the measured values.

However, in a same surface area and a same manufacturing technology, a dual pixel is less efficient than a single pixel, especially in terms of Charge-Voltage conversion Factor, or CVF. In particular, the conversion factor CVF contributes to a good dynamic range of the image.

SUMMARY

In accordance with an example embodiment, an image sensor pixel may include an array of four photosites. A transverse isolator wall may separate the array into two rows of two photosites. A longitudinal isolator wall may separate the array into two columns of two photosites. Both ends of the longitudinal wall may be set back relative to the edges of the array. First and second conversion nodes may be arranged in the spaces between the longitudinal wall and the edges of the array, with each conversion node being common to two adjacent photosites. An independent transfer gate may be between each photosite and the corresponding conversion node.

The transfer gates may be located around the conversion nodes. The conversion nodes may have the smallest achievable dimensions in the technology used to manufacture the pixel. Both ends of the transverse wall may contact the edges of the array. The array also may be delimited by peripheral isolator walls. The pixel may further include a collimating microlens of the pixel size common to the four photosites.

BRIEF DESCRIPTION OF THE DRAWINGS

Other potential advantages and features of various embodiments will become more clearly apparent from the following description of particular embodiments provided for exemplary purposes only and represented in the appended drawings, in which.

DETAILED DESCRIPTION

Figure 1:
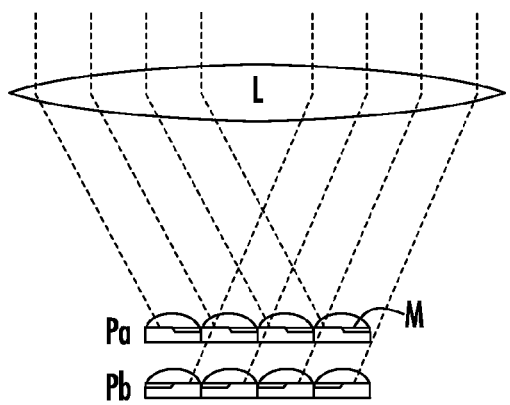
FIG. 1 is a schematic block diagram of a conventional phase detection focus system.
Figure 2:
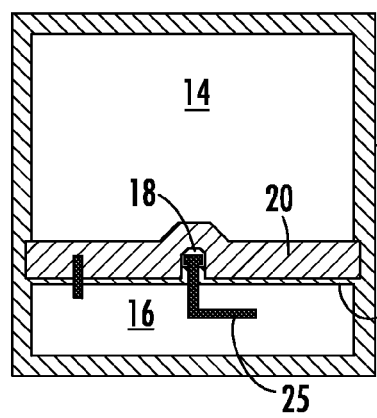
FIG. 2 is a plan view of elements of an example photosensitive pixel, drawn to scale, in accordance with a given manufacturing technology.

FIG. 2 is a top view which illustrates elements of a photosensitive pixel which may be implemented in CMOS technology for 4.1 micron square pixels. The elements of FIG. 2 and the following elements are shown to scale, as they are drawn on etching masks according to the design rules specific to the manufacturing technology.

The pixel is framed by four optically and/or electrically insulating walls forming a pit 10. The walls may be Deep Trench Isolators (DTI) or Capacitive DTIs (CDTI), wherein the isolator is generally silicon oxide. The DTI isolators may extend over the entire height of the active layer of the pixel, typically lightly-doped P-type silicon, and stop on the substrate on which the active layer is formed.

The pit 10 is divided by a transverse DTI isolator 12 into a photosite 14 and a zone 16 for accommodating the pixel control circuits. The zone 16 may occupy approximately 25% of the surface area of the pixel, as shown.

A capacitive conversion node 18 is located in the zone 14 and adjoins the central portion of the DTI isolator 12. A transfer gate 20, typically polysilicon, straddles the interface between the isolator 12 and the zone 14, and surrounds the node 18. The transfer gate 20 is configured to collect as many electrons as possible generated in the photosite 14 to transfer them to the node 18. To achieve good collection efficiency, given the photosite geometry, the gate 20 extends over the entire width of the pixel. Metal tracks 25 connect the node 18 and the gate 20 to circuitry not shown in zone 16.

A performance criterion of a photosensitive pixel is its charge-voltage conversion factor CVF, expressed in microvolts per electron. This criterion is inversely proportional to the capacitance of the conversion node 18 and proportional to the number of electrons that the gate 20 is able to collect for a given luminance and a given exposure duration. The influence of the capacitance of node 18 being predominant, it is desirable to make this capacitance as small as possible. Thus, the node 18 as shown has the smallest size achievable for the given manufacturing technology being used. The other pixel elements may also be sized to achieve the highest possible CVF factor. The pixel of FIG. 2 is used hereinafter as a reference to compare the performance of multiple photosite pixels described below, which may also be implemented using the same technology.

Figure 3:
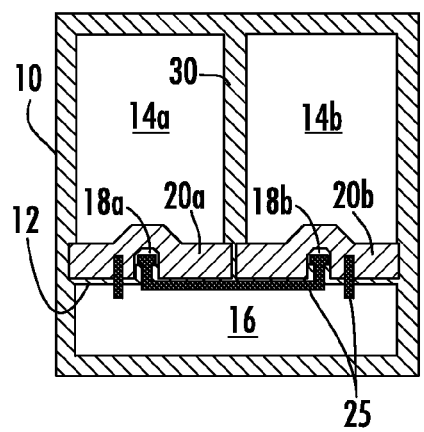
FIG. 3 is a plan view of elements of a dual pixel that may be realized in the same technology as in FIG. 2.

FIG. 3 provides a top view of a dual photosite pixel. The photosite 14 of FIG. 2 is now divided into two photosites 14a and 14b of the same surface area by a longitudinal DTI isolator 30 connected by its ends to the peripheral isolator 10 and the transversal isolator 12. Each pixel is thus in an isolated pit, with its own conversion node 18a, 18b and its own transfer gate 20a, 20b. Each of the gates 20a, 20b extends over the width of the respective photosite, like the transfer gate of FIG. 2. The nodes 18a and 18b are connected together by a metal track, while each of the transfer gates 20a, 20b may be independently controlled by a respective metal track 25.

Due to the addition of the isolator 30 and the configuration of the gates 20a and 20b, which are arc-shaped to surround the nodes 18a and 18b, the useful surface area of the pixel loses about 19% compared to the simple pixel of FIG. 2. By "useful area" it is meant the sum of useful areas of the photosites of the pixel, since the individual charges of all the photosites of the pixel are accumulated to produce the final image after an eventual focus phase.

Moreover, since the nodes 18a and 18b are connected together, the combined capacitance of the two nodes is twice that of the node 18 of FIG. 2. As a result, the CVF factor drops by about 30% compared to the simple pixel of FIG. 2.

Figure 4:
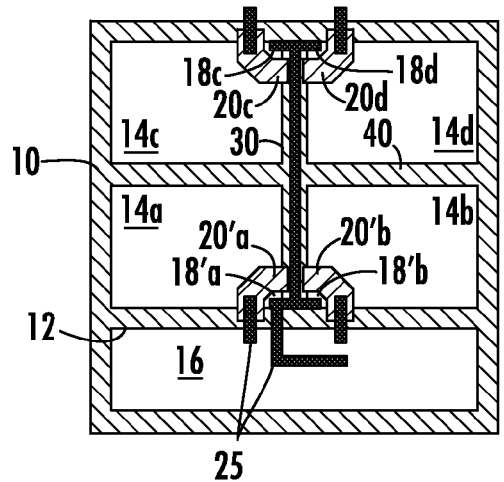
FIG. 4 is a plan view of a quad pixel that may be implemented in the same technology as in FIG. 2.

FIG. 4 provides a top view of a quad-photosite pixel. The photosite 14 of FIG. 2 is now divided into an array of four photosites 14a to 14d of the same surface area by a longitudinal DTI isolator 30 and a transverse DTI isolator 40, each of these isolators contacting the peripheral isolator 10 or the transversal isolator 12. Each photosite is thus in an isolated pit, with its own conversion node 18'a, 18'b, 18c and 18d and its own transfer gate 20'a, 20'b, 20c and 20d.

A dual-photosite pixel of the type of FIG. 3, if it is considered as vertically oriented, is effective for measuring a phase shift with a vertical contrast edge in the image. In the absence of vertical edges in the image, the focus phase may fail. A quad-photosite pixel of the type of FIG. 4 may be used on a vertical edge (using the photosites by columns), a horizontal edge (using the photosites by rows), a 45° tilted edge (using the diagonal photosites 14b and 14c), or a −45° tilted edge (using the diagonal photosites 14a and 14d).

The conversion nodes 18 are here located in the inner corners of the photosites, on the side of zone 16 for the nodes 18'a and 18'b, and on the opposite side for the nodes 18c and 18d. All nodes 18 are connected together by a metal track that may be routed over the isolator 30. The transfer gates 20 are individually controllable by respective metal tracks that may be routed, for the bottom gates, to the area 16 of the pixel and, for the top gates, to the area 16 of the adjacent pixel above (not shown).

The transfer gates 20 here do not extend over the entire width of the photosites but may be located, as shown, around the conversion nodes. Indeed, since each photosite is almost square and has a surface area less than a quarter of that of the photosite of the simple pixel of FIG. 2, the transfer gates do not need to occupy the entire width of the photosites to have sufficient electron collection efficiency.

Thus, the useful surface area of the pixel decreases by only 28% compared to FIG. 2. The conversion factor CVF decreases by about 37%. Despite a limited reduction of the useful surface area, the decrease in the CVF factor is significant because the combined capacitance of the conversion nodes is almost fourfold compared to the basic pixel of FIG. 2.

Figure 5:
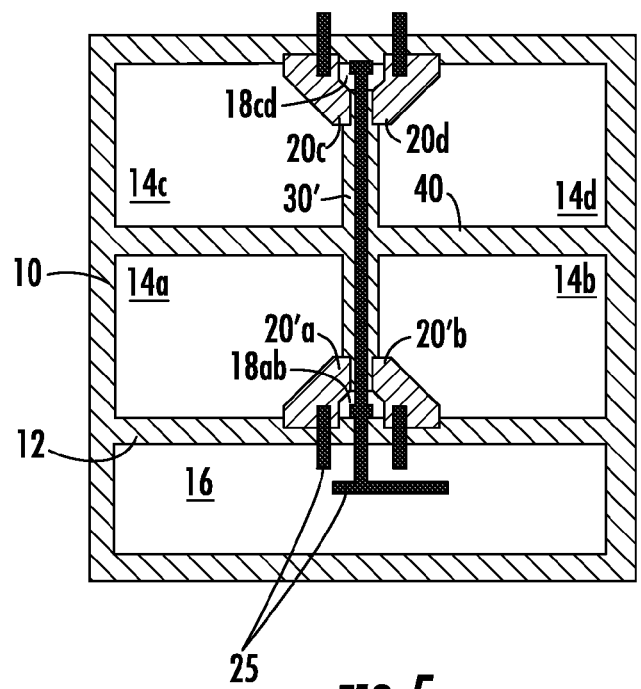
FIG. 5 is a plan view of an embodiment of a quad-pixel having an improved conversion factor relative to the pixels of FIGS. 3 and 4.

FIG. 5 provides a top view of an embodiment of a quad-photosite pixel having a better conversion factor than the pixels of FIGS. 3 and 4. Unlike the pixel of FIG. 4, the longitudinal DTI isolator 30' is not in contact with the isolation surrounding the array (isolator 10 on one side and 12 isolator on the other). The ends of the isolator 30' are sufficiently set back from the edges of the array to accommodate a conversion node at each end, a node designated by 18ab common to photosites 14a and 14b, and a node designated by 18cd common to photosites 14c and 14d.

Thus, the photosites 14a and 14b are not fully isolated from each other. The same applies to the photosites 14c and 14d. Isolation between the photosites of pixels is in principle desired to limit crosstalk between photosites, i.e., the migration of electrons from one photosite to another, which disturbs the measurements and degrades the quality of the image. Such crosstalk is actually not disturbing in the illustrated applications of the pixel of FIG. 5. Indeed, when capturing the final image, the charges of the four photosites are accumulated so that crosstalk between the photosites is reduced. While crosstalk may potentially influence the focusing phase, robust focusing techniques may be used which are insensitive to the effects of the relatively low crosstalk that could potentially result from the narrow passages at the ends of the isolator 30'.

This configuration saves useful surface area by 2% compared to FIG. 4, i.e., the useful surface area is reduced by only 26% compared to FIG. 2. Moreover, this structure allows halving of the cumulated capacitance of the conversion nodes compared to FIG. 4, yielding a decrease in the conversion factor by only 17% compared to the basic pixel of FIG. 2.

Each of the above-described pixels may have a collimating microlens of the size of the pixel mounted thereon. Thus, all four photosites of the pixel of FIG. 5 are covered by the same microlens. The microlenses near the edges of the image sensor may optionally be offset to compensate for vignetting, according to known techniques.

These and other changes may be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

That which is claimed is:

1. An image sensor pixel comprising:
    an array of four photosites;
    a transverse isolator wall separating the array in two rows of two photosites;
    a longitudinal isolator wall separating the array in two columns of two photosites, wherein ends of the longitudinal isolator wall are set back relative to edges of the array to define a space between each end and a corresponding edge of the array;
    first and second conversion nodes positioned in the spaces between the longitudinal isolator wall and the edges of the array, each conversion node being common to two adjacent photosites; and
    transfer gates between each photosite and a corresponding conversion node.

2. The image sensor pixel of claim 1 wherein the transfer gates are located around the conversion nodes.

3. The image sensor pixel of claim 1 wherein the array of photosites is implemented using CMOS circuitry.

4. The image sensor pixel of claim 1 wherein the ends of the transverse wall contact respective edges of the array.

5. The image sensor pixel of claim 1 further comprising a plurality of peripheral isolator walls positioned around the array.

6. The image sensor pixel of claim 1 further comprising a collimating microlens positioned over the four photosites.

7. An image sensor comprising:
   an array of photosites;
   at least one transverse isolator wall separating the array into a plurality of rows of photosites;
   at least one longitudinal isolator wall separating the array in a plurality of columns of two photosites, wherein ends of the at least one longitudinal isolator wall are set back relative to edges of the array to define a space between each end and a corresponding edge of the array;
   a respective conversion node positioned in each space between the at least one longitudinal isolator wall and the edges of the array, each conversion node being common to adjacent photosites; and
   transfer gates between each photosite and a corresponding conversion node.

8. The image sensor of claim 7 wherein the transfer gates are located around the conversion nodes.

9. The image sensor of claim 7 wherein the array of photosites is implemented using CMOS circuitry.

10. The image sensor of claim 7 wherein the ends of the at least one transverse wall contact respective edges of the array.

11. The image sensor of claim 7 further comprising a plurality of peripheral isolator walls positioned around the array.

12. The image sensor of claim 7 further comprising a collimating microlens positioned over the photosites.

13. A method for making an image sensor comprising:
    forming a transverse isolator wall separating an array of four photosites into two rows of two photosites;
    forming a longitudinal isolator wall separating the array into two columns of two photosites, wherein ends of the longitudinal wall are set back relative to edges of the array to define a space between each end and the corresponding edge of the array;
    forming first and second conversion nodes positioned in the spaces between the longitudinal isolator wall and the edges of the array, each conversion node being common to two adjacent photosites; and
    forming transfer gates between each photosite and a corresponding conversion node.

14. The method of claim 13 wherein the transfer gates are located around the conversion nodes.

15. The method of claim 13 wherein the array of photosites is implemented using CMOS circuitry.

16. The method of claim 13 wherein ends of the transverse wall contact respective edges of the array.

17. The method of claim 13 further comprising forming a plurality of peripheral isolator walls around the array.

18. The method of claim 13 further comprising positioning a collimating microlens over the four photosites.

* * * * *